United States Patent
Izaki et al.

(10) Patent No.: US 6,321,355 B1
(45) Date of Patent: Nov. 20, 2001

(54) SEMICONDUCTOR INTEGRATED CIRCUIT AND METHOD OF TESTING THE SAME

(75) Inventors: Kouji Izaki; Tetsuya Takahashi, both of Hadano; Ryo Yamagata, Sagamihara, all of (JP)

(73) Assignees: Hitachi, Ltd., Tokyo; Hitachi Information Technology Co., Ltd., Kanagawa-ken, both of (JP)

( * ) Notice: Subject to any disclaimer, the term of this patent is extended or adjusted under 35 U.S.C. 154(b) by 0 days.

(21) Appl. No.: 09/204,153

(22) Filed: Dec. 3, 1998

(30) Foreign Application Priority Data

Dec. 5, 1997 (JP) .................................................... 9-352466

(51) Int. Cl.[7] .................................................. G01R 31/28
(52) U.S. Cl. ........................................... 714/727; 714/731
(58) Field of Search ..................................... 714/726, 727, 714/724, 731, 733, 734; 326/30, 46, 40

(56) References Cited

U.S. PATENT DOCUMENTS

| | | | |
|---|---|---|---|
| 5,390,190 | * | 2/1995 | Nanda et al. ........................ 714/727 |
| 5,831,993 | * | 11/1998 | Graef .................................... 714/727 |
| 5,896,396 | * | 4/1999 | Sanghani et al. .................... 714/718 |
| 5,920,575 | * | 6/1999 | Gregor et al. ........................ 714/726 |

FOREIGN PATENT DOCUMENTS

| | | |
|---|---|---|
| 4-20879 | 1/1992 | (JP) . |
| 4-105077 | 4/1992 | (JP) . |
| 7-151829 | 6/1995 | (JP) . |

* cited by examiner

Primary Examiner—Christine T. Tu
(74) Attorney, Agent, or Firm—Antonelli, Terry, Stout & Kraus, LLP

(57) ABSTRACT

An LSI having a logic circuit and a test circuit is provided with a first register which is connected between an LSI input/output pin and the logic circuit and has a first input terminal to be outputted from the first register in accordance with a system clock signal and a second input terminal, a second register which has a first input terminal inputted with an output of the first register and a second input terminal inputted with scan-in data and an output of which is connected to the second input terminal of the first register, a selector circuit which is connected to one of the first input terminal of the second register and the second terminal of the first register and selects one of a signal relating to scan-out data and an output signal of the other register so that the selected signal is inputted to the one input terminal, and a third register which receives an output of the second register and provides the received output as scan-out data in accordance with another clock signal. An output of the third register is successively provided to another LSI input/output pin. The selector circuit includes a logic gate circuit inputted with a signal indicative of an LSI test mode and the output signal of the other register.

20 Claims, 3 Drawing Sheets

SEMICONDUCTOR INTEGRATED CIRCUIT AND METHOD OF TESTING THE SAME

BACKGROUND OF THE INVENTION

The present invention relates to a semiconductor integrated circuit in which a circuit for testing an LSI is incorporated.

Boundary-scan architecture has been disclosed by IEEE Std 1149.1a–1993, pp. A8–A12, JP-A-4-105077, JP-A-4-20879 and JP-A-7-151829.

The boundary scan is a system for testing the mounting condition (or the short-circuiting and disconnection) of wiring of an LSI mounted on a board or package. In order to realize this testing, a boundary scan circuit connected to a signal input/output pin of the LSI is incorporated in the LSI.

The boundary scan circuit for testing has the following problem. Namely, notwithstanding that the boundary scan circuit does not contribute to the essential specification of the LSI, the circuit occupies a large area of the LSI chip and hence a so-called overhead becomes large. Therefore, a chip portion capable of being used for the realization of the essential operation specification is oppressed or the area of the chip is increased.

SUMMARY OF THE INVENTION

An object of the present invention is to provide a boundary-scan circuit with which an overhead for the area of an LSI is reduced by the combined use of an up dating register which forms a boundary-scan register and a flip-flop circuit which holds data in a user's logic.

Another object of the present invention is to provide an LSI circuit in which the number of gate circuit stages for LSI test mode interposed in a path between an input pin to an LSI chip and a user's logic and causing a signal delay is reduced.

To that end, one aspect of the present invention provides an LSI having a logic circuit and a test circuit, comprising a first register connected between an LSI input/output pin and the logic circuit, the first register having a first input terminal inputted with a signal to be outputted from the first register in accordance with a system clock signal and a second input terminal, a second register having a first input terminal inputted with an output of the first register and a second input terminal inputted with scan-in data, an output of the second register being connected to the second input terminal of the first register, a selector circuit connected to one input terminal of the first input terminal of the second register and the second terminal of the first register for selecting one of a signal relating to scan-out data and an output signal of the other register so that the selected signal is inputted to the one input terminal, and a third register for receiving an output of the second register and providing the received output as scan-out data in accordance with another clock signal.

An output of the third register is successively provided to another LSI input/output pin.

The selector circuit includes a logic gate circuit inputted with a signal indicative of an LSI test mode and the output signal of the other register.

According to another aspect of the present invention, there is provided a boundary scan circuit which is disposed between an LSI input pin and a user's logic in an LSI circuit having a JTAG circuit incorporated therein and includes a boundary scan register composed of a master register for shifting, a slave register for shifting, and a register for updating provided at a stage in rear of the master shifting register, wherein one terminal pair of a flip-flop for user's logic disposed immediately after the LSI input pin and having two terminal pairs each including an input signal terminal and a clock signal input terminal is used as a data input terminal for user's logic and a terminal for system clock and the other terminal pair is used as a scan data input terminal and a terminal for scan clock so that the flip-flop for user's logic is used as the updating register, wherein the scan data input terminal of the flip-flop for user's logic is inputted with boundary scan data which is to be transferred from the master shifting register to the slave shifting register at the time of boundary scan, and wherein a control circuit for selecting, by an LSI scan mode signal at the time of LSI scan mode, LSI scan-in data inputted from the LSI input pin to the data input terminal for user's logic of the flip-flop for user's logic and outputted from an output terminal of the flip-flop is provided and an output of the control circuit is inputted to the master shifting register.

It may be constructed that at the time of LSI scan mode, the LSI scan-in data is transferred in such a clock two-stage transfer manner that the LSI scan-in data from the LSI input pin is inputted to the data input terminal for user's logic of the flip-flop for user's logic in accordance with a system clock signal and an output of the flip-flop for user's logic is thereafter taken into the master shifting register in accordance with a clock signal for taking the output of the flip-flop into the master shifting register, and an output of the master shifting register is scanned out through the slave shifting register. With this construction in which the LSI scan-in data is scanned out through the shifting registers of the boundary scan circuit, the flip-flop for user's logic used as the updating register for updating is enabled to make scan-in/out at the time of LSI circuit test such as INTEST, RUNBIST or the like which is the JTAG standard. Further, the diagnosis of the user's logic side is enabled.

According to a further aspect of the present invention, there is a boundary scan circuit which is disposed between a user's logic and an LSI output pin in an LSI circuit having a JTAG circuit incorporated therein and includes a boundary scan register composed of a master register for shifting, a slave register for shifting, and a register for updating provided at a stage in rear of the master shifting register, wherein one terminal pair of a flip-flop for user's logic disposed immediately before the LSI output pin and having two terminal pairs each including an input signal terminal and a clock signal input terminal is used as a data input terminal for user's logic and a terminal for system clock and the other terminal pair is used as a scan data input terminal and a terminal for scan clock so that the flip-flop for user's logic is used as the updating register, and wherein a control circuit for selecting an output of the master shifting register at the time of boundary scan and LSI scan-out data at the time of LSI scan-out in accordance with an LSI scan mode signal is provided and an output of the control circuit is inputted to the scan data input terminal of the flip-flop for user's logic.

DESCRIPTION OF THE PREFERRED EMBODIMENTS

An embodiment according to the present invention will be detailed herein with reference to attached drawings.

Tests including INTEST, EXTEST, RUNBIST and so forth as the JTAG standards can be performed by use of a boundary scan technique.

BIST is a technique with which a pattern generator and a code detector are provided in an LSI circuit to generate random data or LSI scan data in the LSI circuit, thereby testing the interior of the LSI. The control of BIST is made using a JTAG circuit and the execution is made by a RUNBIST instruction.

The construction of a boundary scan circuit in the JTAG standard will be described by use of the drawings.

Figure 1:
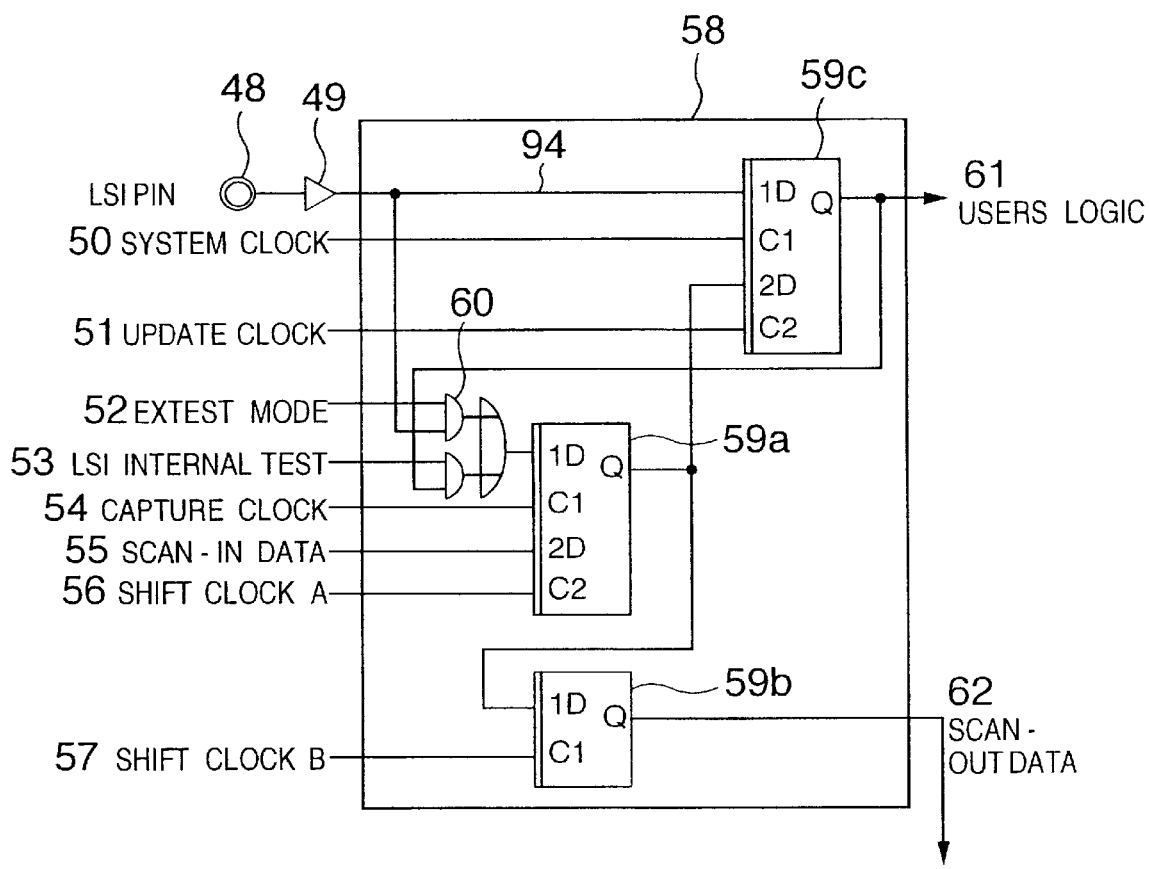
FIG. 1 is a circuit diagram showing the construction of a boundary scan circuit according to a first embodiment of the present invention which is connected to an LSI input pin.

FIG. 1 shows the construction of a first embodiment of the present invention in the case where a boundary scan register is connected between an LSI input pin and a user's logic provided in a package of an LSI circuit.

In FIG. 1, reference numeral 48 denotes an LSI input pin for introducing a signal into an LSI (not shown), numeral 49 a buffer, and numeral 58 a boundary scan register.

The boundary scan register 58 includes three registers 59a, 59b and 59c. The register 59a is a master register for shifting. The register 59b is a slave register for shifting. The register 59c in a path from the LSI input pin to the user's logic is a register for updating. The scan operation side of this flip-flop, that is, a portion thereof operating on the basis of an input signal terminal 2D and a clock signal input terminal C2 holds data to be provided to the user's logic.

Figure 2:
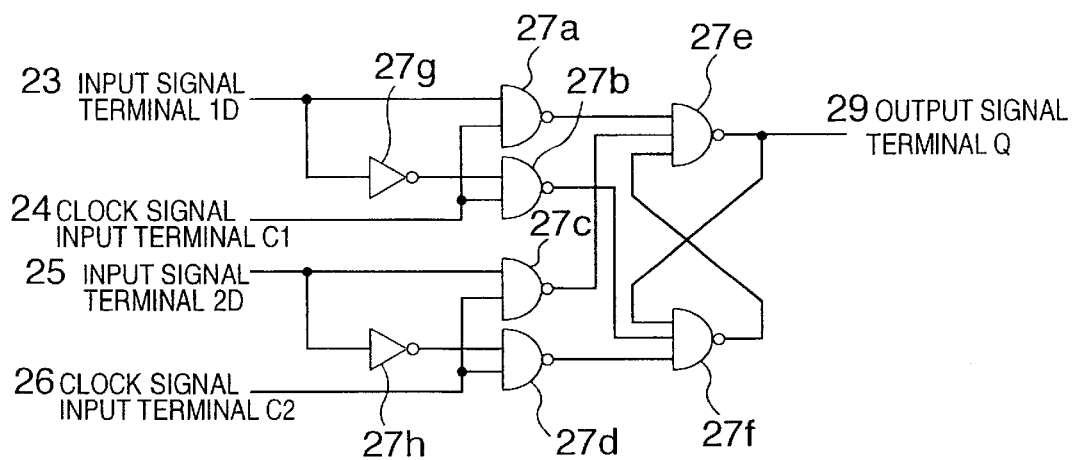
FIG. 2 is a circuit diagram showing the construction of each of a master register for shifting and a register for updating shown in FIG. 1.

The circuit construction of each of the registers 59a and 59c is shown in FIG. 2. In the figure, reference numerals 23 and 25 denote input signal terminals, numerals 24 and 26 clock signal input terminals, numeral 29 an output signal terminal, and numerals 27a to 27h logic circuits.

In the case where a signal of the input signal terminal (ID) 23 assumes a high level and when the clock signal input terminal (C1) 24 assumes a high level and the clock signal input terminal (C2) 26 assumes a low level, the output of 27a takes a low level, the output of 27b takes a high level and each of the outputs of 27c and 27d takes a high level. Thereby, the output of 27e takes a high level, that is, the output signal terminal (Q) 29 takes a high level so that a signal having the same level as the signal level of the input terminal (ID) 23 is outputted from the output signal terminal (Q) 29. Reversely, in the case where the signal of the input signal terminal (ID) 23 assumes a low level, the signal level of the output signal terminal (Q) 29 takes a low level.

When each of the clock signal input terminal (C1) 24 and the clock signal input terminal (C2) 26 assumes a low level, the level of a signal outputted to the output terminal (Q) 29 is held as it is.

When the clock signal input terminal (C1) 24 assumes a low level and the clock signal input terminal (C2) 26 assumes a high level, the signal level of the input terminal (2D) 25 is outputted to the output terminal (Q) 29.

When each of the clock signal input terminal (C1) 24 and the clock signal input terminal (C2) 26 assumes a low level, the level of a signal outputted to the output terminal (Q) 29 is held as it is.

Figure 3:
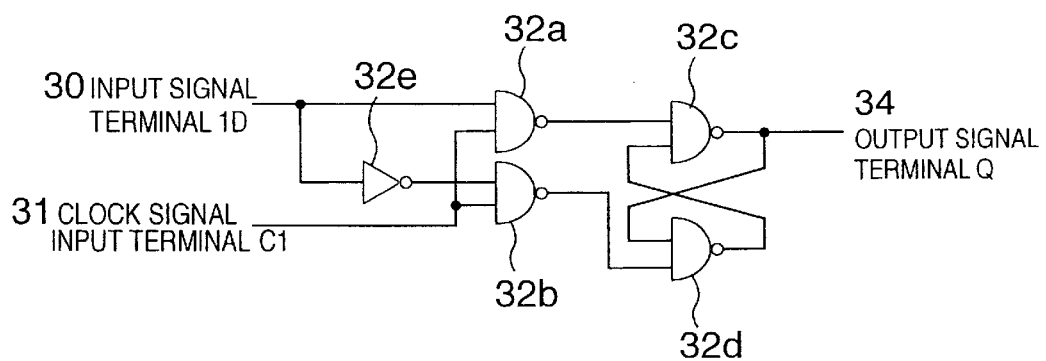
FIG. 3 is a circuit diagram showing the construction of a slave register for shifting shown in FIG. 1.

FIG. 3 shows the circuit construction of the register 59b. In FIG. 3, reference numeral 30 denotes an input signal terminal, numeral 31 a clock signal input terminal, numeral 34 an output signal terminal, and numerals 32a to 32e logic circuits.

In the case where a signal of the input signal terminal (ID) 30 assumes a high level and when the clock signal input terminal (C1) 31 assumes a high level, the outputs of 32a and 32b take a low level and a high level, respectively, so that the output of 32c takes a high level, that is, the output signal terminal (Q) 34 takes a high level. Namely, a signal having the same level as the signal level of the input terminal (ID) 30 is outputted. Reversely, in the case where the signal of the input signal terminal (ID) 30 assumes a low level, the output signal terminal (Q) 34 takes a low level.

When the clock signal input terminal (C1) 31 assumes a low level, the value of the output terminal (Q) 34 is held as it is.

In the case where EXTEST of the boundary scan is performed using the boundary scan register 58 composed of the group of registers 59a to 59c, boundary scan-in data 55 in a series of successively scanned LSI pins, which is the output of the immediately preceding stage of boundary scan register, is outputted to the output of the master shifting register 59a when a shift clock (A) 56 is turned to a high level and a clock (C1) 50 assumes a low level.

The output of the master shifting register 59a is outputted to the output of the slave shifting register 59b when a shift clock (B) 57 is turned to a high level.

This output serves as boundary scan-out data 62 which is connected to the succeeding stage of boundary scan register so that the data is successively shifted as boundary scan data by the shift clock to a boundary scan register connected to an LSI pin to be tested.

On the other hand, in order to taken in data from the LSI pin 48, a capture clock 54 is turned to a high level so that the data is outputted to the output of the master shifting register 59a. This data is outputted as boundary scan-out data 62 by the shift clock (B) 57 to the output of the slave shifting register 59b.

At the time of INTEST of the boundary scan which is a test of the interior of the LSI circuit, an update clock 51 is turned to a high level so that boundary scan data shifted through the boundary scan register (or the output of the master shifting register 59a) is outputted to the output of the updating register 59c and a selector 60 for selecting data from the LSI pin and the boundary scan data in accordance with an LSI internal test mode signal 53 selects the boundary scan data which is in turn taken into the user's logic 61. The LSI internal test mode signal pin 53 may be used for INTEST, RUNBIST and so forth.

Thus, no selector causing a data signal delay exists between the LSI pin 48 and that flip-flop 59c among three registers forming one boundary scan register which holds data to be outputted to the user's logic. Therefore, it is possible to improve a speed at which the LSI performs its essential operation.

Though the user's logic side of the flip-flop 59c for user's logic also serving as the updating register for boundary scan (or a portion thereof operating on the basis of signals from the input signal terminal 1D and the clock signal input terminal C1) outputs data from the LSI pin 48 to the user's logic 61 in accordance with the system clock 50, the scan operation side of the flip-flop 59c is used as the updating register of the boundary scan register. Therefore, this flip-flop is disabled to make scan-in/out at the time of LSI scan (or at the time of test of LSI itself) with the result that the diagnosis of the connecting condition of a signal 94 from the system pin 48 to the flip-flop 59c becomes impossible at the time of LSI scan.

This problem is solved in a clock two-stage transfer manner that at the time of LSI scan, data taken in from the LSI pin 48 is outputted from the flip-flop 59c in accordance with the system clock 50, this output data is selected by the selector 60 in accordance with the LSI scan mode signal 53, and the capture clock 54 is turned to a high level so that the data is outputted to the output of the master shifting register 59a, whereby the scan-out of the connecting condition of the signal 94 to the scan-out data 62 is enabled by the master shifting register 59a and the slave shifting register 59c and the diagnosis of the user's logic side is enabled by the flip-flop for user's logic also used as the updating register.

Figure 4:
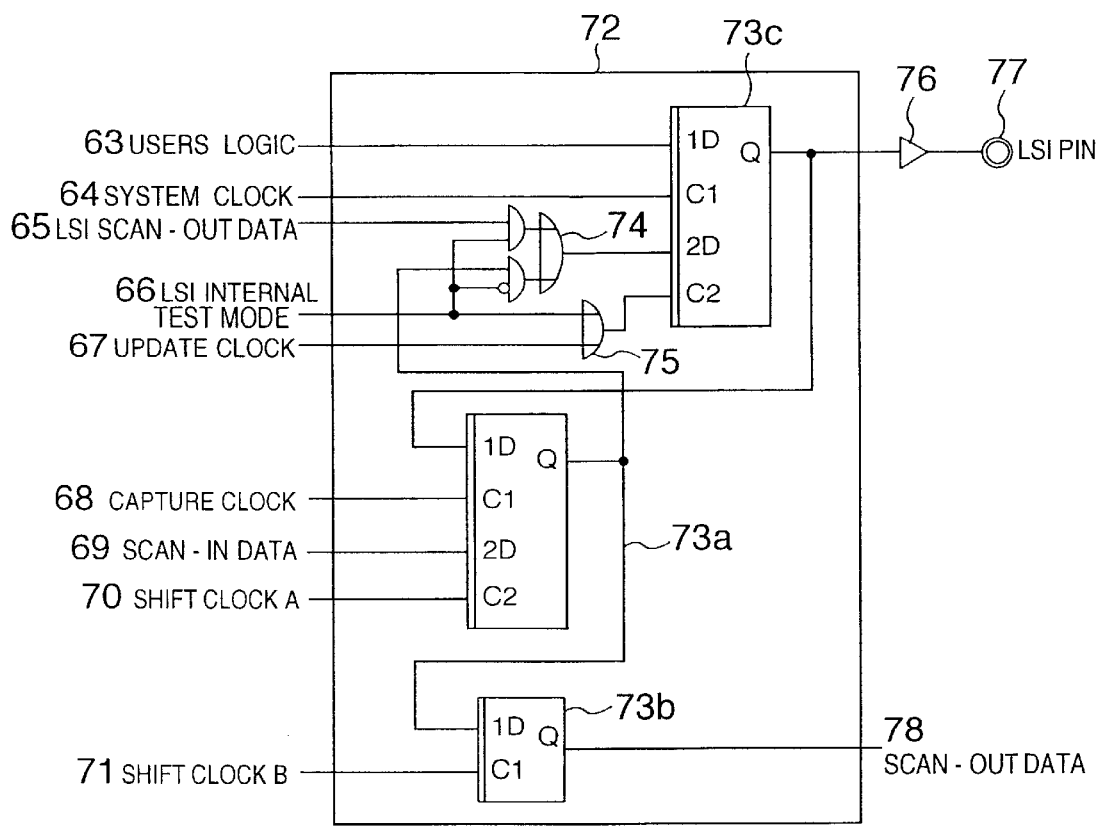
FIG. 4 is a circuit diagram showing the construction of a boundary scan circuit according to a second embodiment of the present invention which is connected to an LSI output pin.

FIG. 4 shows a boundary scan circuit according to a second embodiment which is connected between a system output pin and a user's logic.

In the present circuit too, a flip-flop 73c for user's logic immediately before an LSI pin 77 is incorporated in a boundary scan register 72 in a manner similar to the circuit shown in FIG. 1 so that the scan operation side of this flip-flop can be used as an updating register of the boundary scan register, thereby reducing an updating register of the boundary scan register.

In the case where EXTET of the boundary scan is performed using the present boundary scan register, boundary scan-in data 69 as the output of the preceding stage of boundary scan register is outputted to the output of a master shifting register 73a when a shift clock (A) 70 is turned to a high level.

This output is outputted to the output of a slave shifting register 73b at the time of turn of a shift clock (B) 71 to a high level so that it serves as boundary scan-out data 78. Namely, the output is connected to the succeeding stage of boundary scan register so that the data is successively shifted as boundary scan data by the shift clock to boundary scan registers connected to all system pins.

In order to output boundary scan data to the system output pin 77 at the time of EXTEST of the boundary scan, an LSI scan mode signal 66 is turned to a low level to cause a selector 74 to select boundary scan data outputted from the master shifting register 73a and an update clock 67 is turned to a high level to take in the boundary scan data from the scan input side of the flip-flop 73c for user's logic also serving as the updating register of the boundary scan register so that it is outputted to the LSI pin 77.

In order to output LSI scan-out data 65 to the LSI pin 77, the LSI scan mode signal 66 is turned to a high level at the time of LSI scan so that the LSI scan-out data 65 is selected by the selector 74 provided at a stage in front of the scan input side of the flip-flop 73c for user's logic also serving as the updating register of the boundary scan register. The scan clock continues to take a high level by virtue of the LSI scan mode signal 66 so that the LSI scan-out data 65 is passed through the flip-flop 73c for user's logic and is outputted to the system output pin 77.

In an LSI circuit of the present invention as mentioned above, a flip-flop for user's logic is used as an updating register of a boundary scan register to reduce the number of registers, thereby reducing an overhead for the chip area. The flip-flop for user's logic is enabled to make scan-in/out, thereby enabling the diagnosis of the user's logic and making it possible to output scan data in the LSI to an LSI pin.

What is claimed is:

1. An LSI having a logic circuit and a test circuit, comprising:
   a first register connected between an LSI input/output pin and said logic circuit, coupled to receive input signals and to provide an output in accordance with a clock signal;
   a second register coupled to receive an output of said first register and scan-in data, and to provide an output which serves as one of the input signals to said first register;
   a third register coupled to receive an output of said second register and to provide the output from said second register as scan-out data in accordance with another clock signal; and
   a selector circuit arranged to select one of a signal relating to the scan-out data and an output of one of said first and second registers so that the selected signal is inputted to an opposite one of said first and second registers.

2. An LSI according to claim 1, wherein an output of said third register is successively provided to another LSI input/output pin.

3. An LSI according to claim 1, wherein said selector circuit includes a logic gate circuit coupled to receive a signal indicative of an LSI test mode and an output of said one of said first ands second registers.

4. An LSI having a logic circuit and a test circuit incorporated therein, comprising:
   a first register connected between an LSI input/output pin and said logic circuit for receiving an input signal from said LSI input/output pin and outputting said input signal in accordance with a system clock signal;
   a selector circuit connected to said first register and said LSI input/output pin for selecting any one of an output of said first register and said input signal in accordance with a signal indicative of a test item for the LSI;
   a second register connected to an output of said selector circuit for providing the output from said selector circuit in accordance with another clock signal; and
   a third register connected to said second register for receiving an output of said second register and providing the output from said second register in accordance with a further clock signal;
   wherein said first register receives the output of said second register and selectively provides any one of the output of said second register and the input signal to said logic circuit in accordance with said system clock signal and a still further clock.

5. An LSI according to claim 4, wherein a signal provided from said third register is successively provided to another LSI input pin.

6. An LSI according to claim 4, wherein said selector circuit includes a first logic gate circuit inputted with a signal indicative of a first LSI test mode and the signal to said input/output pin, a second logic gate circuit inputted with a signal indicative of a signal indicative of a second LSI test mode and the output of said first register, and a third logic gate circuit inputted with the outputs of said first and second logic gate circuits, an output of said third logic gate circuit being provided to said second register in accordance with said other clock signal.

7. An LSI according to claim 6, wherein the output from said third register is successively provided to another LSI input pin.

8. An LSI having a logic circuit and a test circuit, comprising:
   a first register connected between said logic circuit and an LSI input/output pin, and coupled to receive input signals and to provide an output in accordance with a clock signal;
   a second register coupled to receive an output of said first register and scan-in data, and to provide an output which serves as one of the input signals to said first register;
   a third register coupled to receive an output of said second register and to provide the output from said second register as scan-out data in accordance with another clock signal; and
   a selector circuit connected to said first register and arranged to select one of a signal relating to the scan-out data and an output of said second register so that the selected signal is inputted to said first register.

9. An LSI according to claim 8, wherein an output of said third register is successively provided to another LSI input/output pin.

10. An LSI according to claim 8, wherein said selector circuit includes a logic gate circuit inputted with a signal indicative of an LSI test mode and the output signal of said second register.

11. A signal processing method in a boundary scan circuit having a plurality of flip-flops including a user register having two inputs, a master register having two inputs and a slave register having an input disposed between a user's logic and an LSI input/output pin in an LSI circuit, said method comprising:
   inputting a data signal for said user's logic and a system clock signal to one of said two inputs of said user register which provides a signal to said user's logic;
   receiving a scan data signal from an output of said master register and a scan clock signal to the other of said two inputs of said user register and to said input of said slave register at the time of boundary scan;
   selecting LSI scan-in data by inputting an LSI internal test mode signal to one of said two inputs of said master register at the time of a LSI internal test mode; and
   inputting said LSI scan-in data inputted from said LSI input/output pin to the other of said two inputs of said master register.

12. A signal processing method according to claim 11, further taking an output of said master register in accordance with a clock signal to provide a scan-out data signal to said input of said slave register.

13. A signal processing method in a boundary scan circuit including a plurality of flip-flops disposed between a user's logic and an LSI pin in an LSI circuit, said boundary scan circuit including a master register having two inputs, a slave register connected to said master register and having an input, and a user register having two inputs at a stage in rear of said master register, said method comprising:
   inputting a data signal for said user's logic and a system clock signal to one of said two inputs of said user register which provides a signal to said LSI pin;
   inputting a scan data signal and a scan clock signal to the other one of said two inputs of said user register;
   selecting an output of said master register at the time of boundary scan, and LSI scan-out data at the time of LSI scan-out for input to said other one of said two inputs of said user register in accordance with an LSI internal test mode signal; and
   inputting an output of said master register to the input of said slave register.

14. A boundary scan circuit arranged to conduct a sequence of testing operations for faulty connections of an integrated circuit (IC), said boundary scan circuit comprising:
   a first register connected between a signal input/output (I/O) pin and said integrated circuit (IC), and having input terminals coupled to receive input signals and a first clock signal, and an output terminal arranged to provide an output signal in accordance with said first clock signal;
   a second register having input terminals coupled to receive scan-in data, the output signal from said first register and a second clock signal, and an output terminal arranged to provide an output signal in accordance with said second clock signal which serves as one of the input signals of said first register;
   a third register having input terminals coupled to receive the output signal from said second register and a third clock signal, and an output terminal arranged to provide scan-out data; and
   a selector arranged to control operation of one of said first register and said second register, in dependence upon whether said signal I/O pin serves as an input pin for supplying another one of the input signals of said first register to said first register or an output pin for supplying the output signal of said first register to said integrated circuit (IC), so as to conduct said sequence of testing operations for faulty connections of said integrated circuit (IC).

15. The boundary scan circuit according to claim 14, wherein, when said signal I/O pin serves as said input pin, said selector is arranged to receive another one of the input signals of said first register and the output signal of said first register and logically combine with test mode signals to drive said second register to generate the output signal which serves as the input signal to both said first register and said third register.

16. The boundary scan circuit according to claim 14, wherein, when said signal I/O pin serves as said output pin, said selector is arranged to receive the scan-out data and the output signal of said second register and logically combine with test mode signals to drive said first register to generate the output signal, via said output pin, which also serves as the input signal to said second register.

17. The boundary scan circuit according to claim 14, wherein said first register comprises:
   a first logic gate arranged to logically combine one of the input signals and said first clock signal to produce a first logic signal;
   a second logic gate arranged to logically combine an invert of said one of the input signals and said first clock signal to produce a second logic signal;
   a third logic gate arranged to logically combine said another one of the input signals and an update clock signal to produce a third logic signal;
   a fourth logic gate arranged to logically combine an invert of said another one of the input signals and said update clock signal to produce a fourth logic signal;
   a fifth logic gate arranged to logically combine said first and third logic signals and a feedback signal to produce the output signal; and
   a sixth logic gate arranged to logically combine said second and fourth logic signals and the output signal to produce the feedback signal.

18. The boundary scan circuit according to claim 14, wherein said second register comprises:
- a first logic gate arranged to logically combine the output of said first register and said second clock signal to produce a first logic signal;
- a second logic gate arranged to logically combine an invert of the output signal of said first register and said second clock signal to produce a second logic signal;
- a third logic gate arranged to logically combine said scan-in data and a capture clock signal to produce a third logic signal;
- a fourth logic gate arranged to logically combine an invert of said scan-in data and said capture clock signal to produce a fourth logic signal;
- a fifth logic gate arranged to logically combine said first and third logic signals and a feedback signal to produce the output signal; and
- a sixth logic gate arranged to logically combine said second and fourth logic signals and the output signal to produce the feedback signal.

19. The boundary scan circuit according to claim 14, wherein said third register comprises:
- a first logic gate arranged to logically combine the output signal of said second register and said third clock signal to produce a first logic signal;
- a second logic gate arranged to logically combine an invert of the output signal of said second register and said third clock signal to produce a second logic signal;
- a third logic gate arranged to logically combine said first logic signal and a feedback signal to produce scan-out data; and
- a fourth logic gate arranged to logically combine said second logic signal and said scan-out data to produce the feedback signal.

20. The boundary scan circuit according to claim 14, wherein said first, second and third registers correspond to a series of flip-flops implemented by NAND gates.

* * * * *